(12) United States Patent
Fayfield et al.

(10) Patent No.: US 6,287,413 B1
(45) Date of Patent: *Sep. 11, 2001

(54) APPARATUS FOR PROCESSING BOTH SIDES OF A MICROELECTRONIC DEVICE PRECURSOR

(75) Inventors: Robert T. Fayfield, St. Louis Park; Brent Schwab, Burnsville, both of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/464,780

(22) Filed: Dec. 17, 1999

Related U.S. Application Data

(63) Continuation of application No. 08/955,355, filed on Oct. 21, 1997, now Pat. No. 6,165,273.

(51) Int. Cl.[7] ................. C23F 1/02; C23C 16/00
(52) U.S. Cl. ............. 156/345; 118/715; 118/724; 118/725; 250/492.1; 250/492.2
(58) Field of Search .................. 118/722, 715, 118/724, 725, 728; 156/345; 250/492.1, 492.2

(56) References Cited

U.S. PATENT DOCUMENTS

| | | | |
|---|---|---|---|
| 4,028,135 | 6/1977 | Vig et al. ................. | 134/1 |
| 4,167,669 | 9/1979 | Panico ................. | 250/341 |

(List continued on next page.)

FOREIGN PATENT DOCUMENTS

| | | |
|---|---|---|
| 2 181 458 A | 4/1987 | (GB) . |
| 1-235232 | 9/1983 | (JP) ................. H01L/21/20 |
| 4-25116 | 1/1992 | (JP) . |
| 5-047741 | 2/1993 | (JP) ................. H01L/21/308 |
| WO 90/13910 | 11/1990 | (WO) . |
| 91/03075 | 3/1991 | (WO) . |

OTHER PUBLICATIONS

T. Aoyama et al., Surface Cleaning for Si Epitaxy Using Photoexcited Fluorine Gas, *J. Electrochem. Soc.*, vol. 140, No. 2, pp. 366–371, Feb. 1993.
Derwent patent abstract, JP 61–053731 (3/86).
Derwent patent abstract, JP 61–51585 (5/94).
JAPIO patent abstract, JP 01–104682 (4/89).
IFI/Plenum patent abstract, US 5451425 (9/95).
IFI/Plenum patent abstract, US 4798960 (1/89).

(List continued on next page.)

*Primary Examiner*—Jeffrie R. Lund
(74) *Attorney, Agent, or Firm*—Vidas, Arrett & Steinkraus

(57) ABSTRACT

The apparatus of the present invention provides for the dual use of a UV source to heat a substrate and to facilitate photochemistry necessary for the treatment of the substrate.

The present invention also provides a method for processing a substrate by heating the substrate to a temperature above ambient via UV radiation at a first power level and conditioning the substrate by exposing the substrate to a photochemically (UV) reactive chemical, or a reactive chemical that can react with a compound on the surface of the substrate to form a photochemically reactive compound, in the presence of UV radiation at a second power level.

15 Claims, 2 Drawing Sheets

U.S. PATENT DOCUMENTS

| | | | |
|---|---|---|---|
| 4,443,533 | 4/1984 | Panico | 430/311 |
| 4,522,674 | 6/1985 | Ninomiya et al. | 156/345 |
| 4,540,466 | 9/1985 | Nishizawa | 156/643 |
| 4,568,632 * | 2/1986 | Blum et al. | 427/53.1 |
| 4,643,799 | 2/1987 | Tsujii et al. | 156/643 |
| 4,678,536 | 7/1987 | Murayama et al. | 156/635 |
| 4,687,544 | 8/1987 | Bersin | 156/643 |
| 4,705,593 | 11/1987 | Haigh et al. | 156/635 |
| 4,711,790 | 12/1987 | Moirshige . | |
| 4,741,800 | 5/1988 | Yamazuki | 156/643 |
| 4,756,047 | 7/1988 | Hayashi et al. | 15/306 B |
| 4,857,382 * | 8/1989 | Liu et al. | 156/345 |
| 4,871,416 | 10/1989 | Fukuda | 156/635 |
| 4,986,216 | 1/1991 | Ohmori et al. | 118/730 |
| 5,085,887 * | 2/1992 | Adams et al. | 427/55 |
| 5,119,760 * | 6/1992 | McMillan et al. | 118/722 |
| 5,228,206 | 7/1993 | Grant et al. | 34/1 |
| 5,288,684 | 2/1994 | Yamazaki et al. | 118/722 |
| 5,332,442 | 7/1994 | Kubodera et al. | 118/725 |
| 5,439,553 | 8/1995 | Grant et al. | 216/58 |
| 5,470,799 | 11/1995 | Itoh et al. . | |
| 5,551,982 * | 9/1996 | Anderson et al. | 118/715 |
| 5,551,985 * | 9/1996 | Brors et al. | 118/725 |
| 5,576,059 * | 11/1996 | Beinglass et al. | 427/255 |
| 5,580,421 | 12/1996 | Hiatt et al. | 150/643 |
| 5,645,646 * | 7/1997 | Beinglass et al. | 118/730 |
| 5,789,755 * | 8/1998 | Bender | 250/492.1 |
| 5,814,156 | 9/1998 | Elliott et al. | 134/1 |
| 5,861,609 * | 1/1999 | Kaltenbrunner et al. | 219/390 |
| 5,863,843 * | 1/1999 | Green et al. | 438/771 |
| 5,870,526 * | 2/1999 | Ashner et al. | 392/416 |
| 6,015,759 | 1/2000 | Khan et al. | 438/707 |
| 6,051,512 * | 4/2000 | Sommer et al. | 438/795 |
| 6,075,922 * | 6/2000 | Tay et al. | 392/416 |
| 6,099,648 * | 8/2000 | Anderson | 118/715 |
| 6,165,273 * | 12/2000 | Fayfield et al. | 118/722 |

OTHER PUBLICATIONS

Derwent patent abstract, KR 9405754 (6/94).
Derwent patent abstract, KR 9301193 (2/93).
Derwent patent abstract, JP 5070295 (3/93).
Derwent patent abstract, JP 62–174925 (7/87).
Derwent patent abstract, JP 62086731 (4/87).
Derwent patent abstract, JP 52144021 (12/77).
JAPIO patent abstract, JP 06–157190 (6/94).
JAPIO patent abstract, JP 01–235232 (9/89).
Ruzyllo, section 7–3 of Semiconductor Wafer Cleaning Technology, (2/93).
Patent abstract of Japan, abstract of JP 63–297563 (5/88).
Derwent patent abstract, JP 62–166529, (7/87).

* cited by examiner

APPARATUS FOR PROCESSING BOTH SIDES OF A MICROELECTRONIC DEVICE PRECURSOR

This application is a Continuation of U.S. application Ser. No. 08/955,355 filed Oct. 21, 1997, issued as U.S. Pat. No. 6,165,273, the contents of which are incorporated by reference.

BACKGROUND OF THE INVENTION

1. Field of the Invention

The present invention relates to an apparatus with an ultraviolet (UV) source for UV heating and photochemical treatment of substrates, including semiconductor substrates, and a method for processing said substrates using said apparatus. It finds particular application in etching, cleaning, or bulk stripping of films or contaminants from the surface of a semiconductor substrate at temperatures of about 400° C. or less for use in the fabrication of integrated circuits.

2. Description of the Related Art

In the processing of semiconductor substrates, including cleaning, etching or other treatments, it is well known to use ultraviolet (UV) activated gases. U.S. Pat. No. 5,580,421 to Hiatt et al, incorporated herein by reference, describes an apparatus for processing a substrate with a UV activatable conditioning gas. In copending application Ser. No. 08/621, 538 filed Mar. 25, 1996, incorporated herein by reference, a method of removing undesired material from a substrate using fluorinated gases is disclosed. In copending application Ser No. 08/818,890 filed Mar. 17, 1997, incorporated herein by reference, a method using UV/halogen for metals removal is disclosed. Because chemical reaction rates are generally temperature dependent, the efficiency of a treatment can be dependent on the temperature at which the treatment is run. It can be desirable to preheat a substrate in a well controlled manner to a preferred process temperature above ambient temperature to provide enhanced process performance. Heating may also be used to thermally desorb volatile species adsorbed on the surface of a substrate.

There are a number of ways of heating a substrate in preparation for chemical processing or for thermally desorbing volatile species. The conventional way of heating, placing the substrate directly on a heating element, does not allow for access to both sides of the substrate. This can pose a problem in particular where one wishes to process both sides of a substrate. This also does not allow for multitemperature sequences with reasonable throughput.

Another way of heating a substrate is by applying a heated gas to the substrate. The use of a heated gas to heat a substrate is inefficient, however.

Yet another way of heating a substrate is via the application of infrared (IR) radiation to the substrate as in rapid thermal processing. However, if both heating and UV illumination are required this introduces considerable engineering difficulties, adding to the expense of any processing tool so equipped. These difficulties include control over stray chamber heating, control over the substrate temperature, and the logistics of incorporating an IR bulb, a UV bulb, and their respective control systems together in an apparatus.

The drawbacks of the above heating methods in the treatment of semiconductor substrates highlight the need for an inexpensive method to uniformly heat substrates to a desired process temperature and provide UV illumination in a single apparatus.

SUMMARY OF THE INVENTION

It is a goal of the present invention to provide a novel apparatus for heating and phototreatment of a silicon containing substrate that overcomes the problems associated with the above-mentioned methods of heating by exploiting a UV source present for phototreatment of a silicon containing substrate to also heat the substrate. The apparatus of the present invention comprises a reaction chamber for receiving and holding the substrate, a UV radiation source configured to direct radiation at the substrate, and a control system for controlling the UV radiation source. The UV source is capable of providing UV output of at least two different time averaged power levels, a heating level being effective to induce heating of the substrate and a photochemical level being effective to induce said phototreatment. Optionally, the present invention further comprises a chemical delivery system to deliver chemical into the reaction chamber. The present invention may also include at least one UV transparent window through which the UV radiation may be transmitted into the chamber.

In one embodiment of the present invention, in which a first UV lamphouse is mounted on the front side of the reaction chamber and a second UV lamphouse is mounted on the back side of the chamber, a substrate may be heated uniformly on both sides by directing UV radiation at both the front and back sides of the substrate simultaneously. In another embodiment, one side of the substrate is subject to UV at a heating level and the other side of the substrate is subject to UV radiation at a photochemistry level. In yet another embodiment, a single UV source is used for both heating and photochemistry.

It is a further feature of the present invention to provide a method for processing a substrate by heating the substrate to a temperature above ambient in one or more heating steps via UV output of a first time averaged power level, the heating level, and conditioning the substrate in one or more treatment steps by exposing the substrate to a photochemically (UV) reactive chemical in the presence of UV radiation at a second time averaged level, the treatment level, which is distinct from the first heating level. A photochemically reactive chemical is broadly defined to include those chemicals which become photoactive due to an interaction, such as adsorption on the surface of the substrate. A photochemically reactive chemical is also defined to include species already adsorbed on the surface of the substrate which are caused to photodesorb due to the presence of the impinging UV radiation.

It is a further feature of the present invention to provide a method for processing a substrate by heating the substrate to a temperature above ambient in one or more heating steps via UV output in the absence of a photochemically reactive gas and conditioning the substrate in one or more treatment steps by exposing the substrate to a photochemically (UV) reactive chemical.

The present invention further pertains to a method for performing a UV photochemical treatment on a semiconductor substrate, comprising at least one heating step in which UV radiation is provided to at least a portion of the substrate at a total radiative power density, integrated from 0.1 to 1.0 microns of wavelength, of 0.3 watts/$cm^2$ or higher, and at least one reaction step in which UV radiation at a power level distinct from the heating power level is provided, the UV radiation interacting with at least one photochemically reactive chemical causing a chemical reaction effecting a treatment of the substrate, wherein the power density in the heating step exceeds the power density in the reactive step.

The present invention allows for increased flexibility in treating substrates in that the UV phototreatment and UV heating can be directed independently to one or both sides of the substrate. For example, the front side of a substrate can be protected from direct UV illumination if only gas phase activation is desired. Moreover, because stray heating of the treatment chamber associated with IR heating is reduced to a great extent with a UV heating system, the need for a complex and expensive chamber cooling system is eliminated while a high throughput can be maintained.

DETAILED DESCRIPTION OF THE INVENTION

In the processing of substrates such as semiconductor wafers, it is often necessary to heat the substrate to a desired treatment temperature prior to or during treatment of the substrate. The apparatus of the present invention provides for the dual use of a UV source to heat a substrate and to facilitate photochemistry necessary for the treatment of the substrate.

It is a further aspect of the present invention to provide a method for processing a substrate by heating the substrate on one or both sides to a temperature above ambient in one or more steps via exposure to UV radiation at a first time averaged power level and conditioning the substrate in one or more treatment steps by exposing one or both sides of the substrate to a photochemically (UV) reactive chemical in the presence of UV radiation at a second time averaged power level which is reduced from the first time averaged power level. Photochemically reactive chemicals include those that are photoactive due to an interaction, such as adsorption to the surface of the substrate, or species which are on the surface of the substrate and photodesorb due to the presence of the impinging UV radiation.

Figure 1:
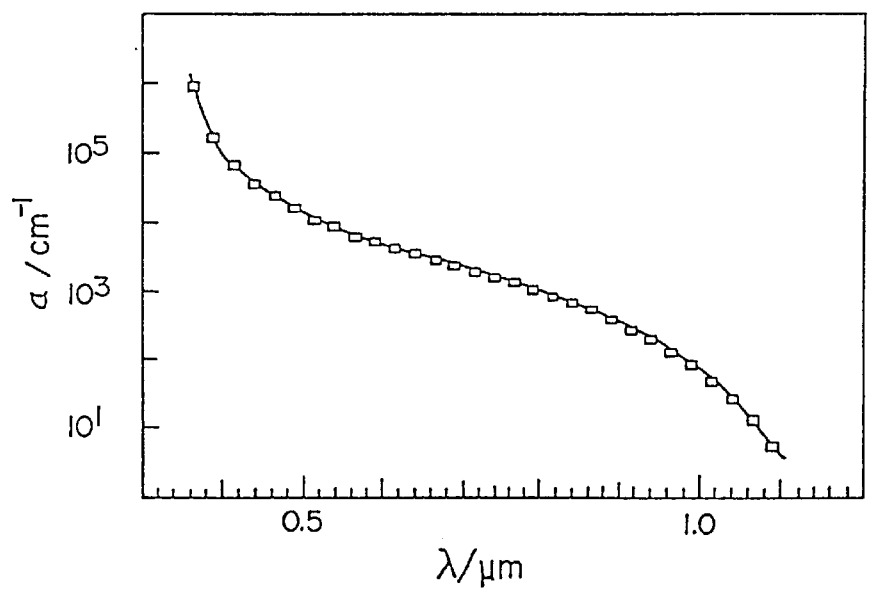
FIG. 1 shows the absorption spectrum of Si in the ultraviolet region at a temperature of 25° C.

The substrate materials which can be treated with the present apparatus can generally be any type of material that can efficiently couple with the delivered photons and absorb the bulk of the energy delivered by the UV source. Examples of such materials include silicon containing substrates, gallium arsenide containing substrates, other semiconductor substrates, or substrates of other materials with appropriate absorption cross sections. This definition also includes substrates which are transparent to the delivered radiation but have an appropriate absorbing thin film deposited on the surface or embedded within. FIG. 1 depicts the absorption spectrum of silicon in the ultraviolet region. The strong UV absorption is indicative of the efficient coupling between silicon and photons delivered by a source typical of that described in the present invention. Hence, the suitability of silicon containing materials for the present invention is readily apparent.

The invention is useful for performing treatments such as oxide etches using UV and halogenated reactants, UV activated metals removal processes, or any other treatment process that involves photochemistry and requires preheating a substrate to temperatures above ambient but less than about 400° C. Above 400° C. thermal excitation makes IR based heating methods more efficient as more free carriers are present, as is observed in rapid thermal processing techniques.

The photochemically reactive chemical can be any type of photochemically reactive gas known for use in etching, cleaning, bulk stripping or otherwise conditioning of the surface of a substrate, but in the preferred embodiment will be comprised of a first gas such as nitrogen, argon, or another inert gas, mixed with one or more photochemically reactive gases. The photochemically reactive gas may be a compound which reacts in the gas phase to form a reactive species such as a radical. Examples of such a photochemically reactive gases include, but are not limited to, $ClF_3$, $F_2$, $O_2$, $N_2O$, $H_2$, $NF_3$, $Cl_2$, other halogenated gases, or a mixture of such gases. The photochemically reactive chemical may also be any chemical, whether gaseous or otherwise, that is capable of reacting with a compound or adsorbing on the surface of the substrate to form a photochemically reactive species. Still other photochemically reactive chemicals include halogenated metals such as $CuCl_2$ and others described in the above-mentioned copending application Ser. No. 08/818,890, filed Mar. 17, 1997. In this case, the photochemically reactive chemical is an adsorbed compound which can photodesorb in the presence of the impinging UV radiation.

Figure 2:
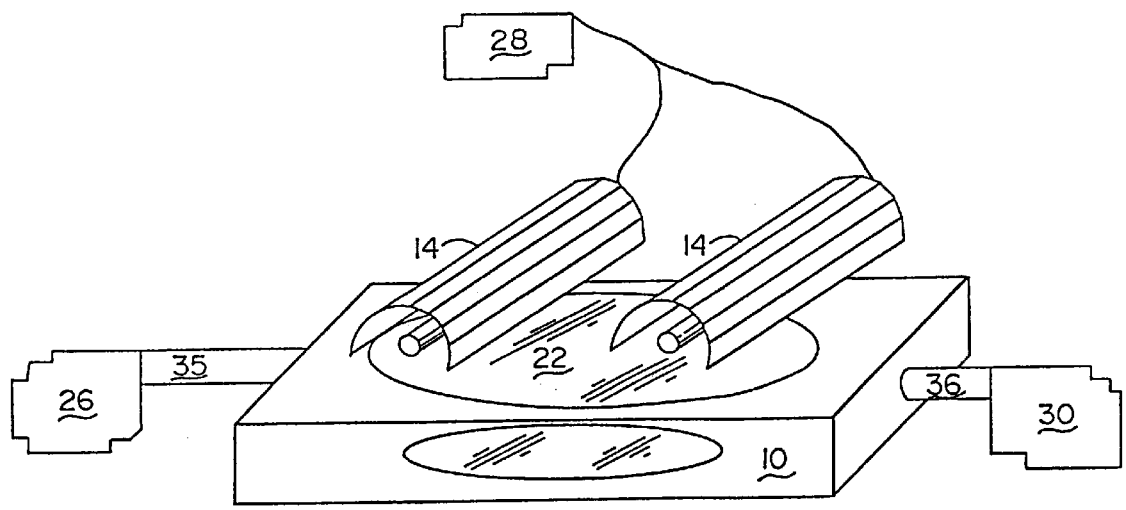
FIG. 2 shows a schematic diagram of an embodiment of the present invention.

FIG. 2 is a schematic diagram of the major component parts of the system which make up an embodiment of our apparatus. The reaction chamber is generally at 10. The UV radiation source comprises a lamphouse 14 mounted on the exterior of the reaction chamber 10. The front of the chamber 10 includes a UV transparent window 22 to allow UV light to pass from the lamphouse 14 into the interior of the chamber to reach the substrate. A chemical delivery system is shown at 26 while a control system for controlling the UV radiation is shown at 28. A vacuum pump 30 is connected to the chamber 10. In operation, chemicals are delivered into the chamber 10 through inlet 35 and are exhausted through outlet 36.

Although only one UV lamp is necessary, the presence of a first lamphouse on the front side and a second lamphouse on the back side of the chamber allows for the simultaneous treatment of both sides of a substrate. Alternatively, either side of the wafer may be illuminated individually as desired. In this embodiment the back side of the chamber also includes a UV transparent window. When two UV lamphouses are employed, it is preferable that the second UV lamphouse is turned at ninety degrees to the first UV lamphouse to facilitate even heating of both sides of the substrate. For convenience we denote both the chamber and substrate as having front and back sides. However, the front side of the substrate need not face the front side of the chamber.

Figure 3:
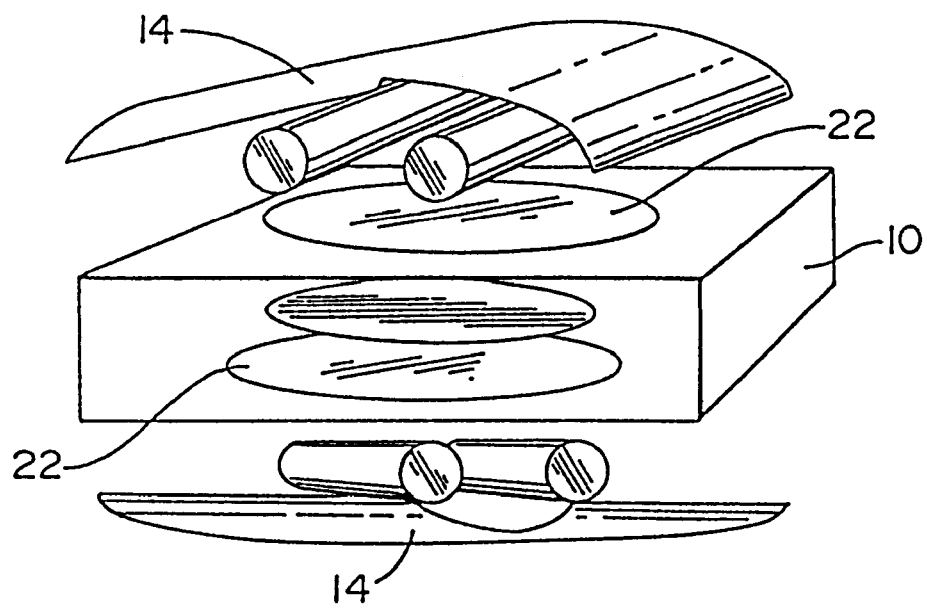
FIG. 3 shows a schematic diagram of the chamber and lamphouse in an embodiment of the present invention.

FIG. 3 depicts the chamber and lamphouses in an embodiment involving both a front side and back side lamphouse. Chamber 10 now has two UV transparent windows 22, one each on the front and back side. Two lamphouses 14, one on the front side and one on the back side, permit illumination of both sides of the wafer. The bottom lamphouse is rotated 90 degrees relative to the front side lamphouse.

In another embodiment the lamp(s) may be mounted inside the chamber. In this embodiment, the UV transparent window is unnecessary.

A suitable UV lamp is a 9 inch (7 millimeter bore) linear, xenon-filled quartz flashlamp (made by Xenon corporation). In our preferred embodiment, two such lamps are placed in a lamphouse. In this embodiment, the lamphouse is provided with 1500 Watts to power the lamps. Other sources of radiation, such as mercury lamps, may also be used as long as the source produces sufficient power in the wavelength range 0.1 to 1.0 microns and the output photons react with the particular chemical system of interest. A more powerful or less powerful UV source may be used. Of course, the power of the lamp will determine how quickly the substrate may be heated. With two 1500 Watt lamphouses, one on the front side and one on the back side, the temperature of a 150 mm silicon wafer ramped from room temperature to 200° C. in approximately 30 seconds.

The flashlamp power supply comprises a power supply capable of delivering an input power of up to 1500 Watts to the lamphouse with a fixed input pulse. Optionally, the power supply may also comprise a pulse forming network designed to maximize power output in the region which is optimal for the desired photochemistry.

While the lamphouse may simply be a device for mounting the UV source, the lamphouse may also comprise one or more cylindrical parabolic or elliptical reflectors.

The apparatus of the present invention is operated in two modes, a heating mode and a photochemistry mode. In the heating mode, either the UV source is operated at a higher power level than in the photochemistry mode or the gas environment is made non-photoactive by, for example, using an inert gas or delivering UV under vacuum. In the photochemistry mode, the power output is either reduced to the level sufficient to carry out the desired photochemistry or the photochemically reactive chemical is introduced.

The UV controller may be any circuitry which when connected to the UV source can allow the UV source to deliver a desired amount of time averaged power at a UV heating level and a desired amount of time averaged power at a photochemically reactive level. One method for controlling the time averaged power is through the use of a variable power supply. The Xenon 740 from Xenon corporation is an example of such a power supply which allows control over the number of pulses per second delivered by the lamphouse. Alternatively, the UV may be controlled manually by an operator.

The present invention may be run in an open loop without any temperature feedback during the heating step. If the UV source is a flashlamp, the low thermal mass allows pulse energy calibration thereby allowing for repeatable temperature control of the substrate in an open loop system. Alternatively, a temperature control system may be provided in conjunction with the programmable control system to modify the output of the UV source so as to achieve and, optionally, maintain a desired substrate temperature. The chamber temperature may be controlled by a feedback mechanism associated with a feedback loop and resistive heater so as to maintain the chamber at a desired temperature after the initial UV heating step.

A temperature control system suitable for the present invention may comprise a temperature sensor and a feedback temperature controller to modulate the output of the UV radiation source. The output of the UV radiation source is characterized by a pulse train, the pulse train characterized by the number of pulses per second of UV radiation and the energy per pulse. The temperature feedback controller modulates the number of pulses per second and/or the energy per pulse. The model DRS 1000 temperature sensor from Thermionics is a commercially available non-contact optical sensor which may be used in the present invention although other temperature sensors may also be used.

The chemical supply system may include one or more sources of chemicals in fluid communication with a plumbing system which is, in turn, in communication with the reaction chamber. The chemical supply system may be configured so as to allow for mixing of one or more gases as well as to allow for the provision of chemicals in the gas phase via any method known in the art.

The vacuum pump can pump the chamber down to less than 10 mTorr. If lower pressures are desired, a higher vacuum pump may be employed.

The present invention allows for greater simplicity in design and construction as a result of diminished stray heating—the need for liquid cooling of the chamber is eliminated as the UV photons do not efficiently couple into the chamber. Moreover, the present invention further allows for greater flexibility and control in the treatment of semiconductor substrates. The apparatus in an appropriate configuration allows for heating a substrate from the back side, the front side, or both sides. Heating of a substrate from the back side is especially advantageous in applications where the substrate must be heated without exposing the front side to high energy UV photons. It is also advantageous where the front side of the substrate contains large amounts of material which does not efficiently couple with the UV photons such as, although not limited to, aluminum or copper. Heating of both sides simultaneously, on the other hand, allows for more rapid temperature ramp than heating from the back side alone. Similarly, the apparatus allows for the phototreatment of a substrate from the front side, the back side, or both sides.

The present invention further relates to a method for performing a Uv photochemical treatment on a semiconductor substrate comprising at least one heating step in which UV radiation at a first time averaged power level—the heating level, is provided to the substrate to heat the substrate and at least one reaction step in which UV radiation at a second time averaged power level, the reactive level, is provided, the heating level exceeding the reactive level. During the reactive step, the UV radiation interacts with at least one photochemically reactive chemical causing a chemical reaction effecting a treatment of the substrate. The heating step may occur in the presence of or absence of a photochemically reactive chemical. The photochemically reactive chemical may be present on the surface of the substrate and/or in the gaseous environment in which the substrate is located. The photochemically reactive chemical may be supplied either directly to the reaction chamber via a chemical delivery system or indirectly as a result of a reaction of a chemical in the gaseous environment with the surface of the substrate to form a photochemically reactive chemical. The photoactively reactive chemical may be generated in the gas phase without exposing the substrate front side to UV photons by using back side only photochemical treatment.

In one embodiment of the invention, the substrate is heated on both sides of the substrate simultaneously, followed by a phototreatment of one or both sides of the substrate. This allows for maximal heating. In another embodiment, involving only one lamp, the substrate is heated on one side only, the back side, to avoid facilitating any photochemistry on the front side during the heating step, followed by phototreatment of the back side so as to create radicals in the reaction chamber which will then react on the front side without desorbing any species from the front side of the substrate. In another embodiment, involving two lamps, following back side heating, the front side of the substrate is subject to direct UV phototreatment. In yet another embodiment, the phototreatment step may precede the heating step. In yet another embodiment, multiple heating and phototreatment steps may be employed. In yet another embodiment, heating can occur simultaneously with phototreatment by directing UV at a heat treatment level to one side of the substrate while simultaneously directing UV at a phototreatment level to the other side of the substrate.

In yet another embodiment, the invention pertains to a method for performing a UV photochemical treatment on a semiconductor substrate, the substrate having a front side and a back side, comprising at least one heating step in which UV radiation is provided to at least a portion of the substrate with a total integrated power density between 0.1 and 1.0 microns of wavelength of 0.3 watts/cm$^2$ or higher, and at least one reaction step in which UV radiation at a power level distinct from the heating level is provided, the UV radiation interacting with at least one photochemically reactive chemical causing a chemical reaction effecting a treatment of the substrate, wherein the power density in the heating step exceeds the power density in the reactive step. A photochemically reactive chemical may, optionally, be present during the heating step.

In any of the above embodiments, the UV source may, during the photochemical step, be operated at such a power level as to maintain or increase the temperature of the substrate.

The following example illustrates the full flexibility of the dual sided UV system.

EXAMPLE 1

A silicon wafer, with a sacrificial SiO$_2$ layer, is subject to UV heating and processing in an ORION® dry gas phase wafer processing tool. The tool is supplied by FSI International Inc. Chaska, Minn. and is configured in accordance with the preferred embodiment of the above disclosure.

Two lamphouses, with two 9" xenon filled flashlamps (produced by Xenon Corporation) and two parabolic reflectors per lamphouse, are each powered by a variable power supply. With the two supply system, the total electrical input energy is maintained at 400 Joules per pulse and the number of pulses per second (pps) is adjusted to vary the time averaged power from 0 to 3000 watts. In the present embodiment, 3000 watts of electrical input power corresponds to approximately 1.5 watts/cm$^2$ of optical power (between 100 and 1000 nm) at the substrate. One lamphouse is located on the front of the processing chamber and one lamphouse is located on the back of the processing chamber.

After the wafer is loaded into the chamber, a first heating step is used to bring the wafer from room temperature (about 23° C.) to the processing temperature of 60° C. during which time the chamber is filled with nitrogen gas to 5 torr. Both lamphouses are operated at their maximum flashrate, 7 pulses per second, to maximize the temperature ramp rate. Under these conditions, the wafer reaches a temperature of 60° C. within 5 seconds. Note, the heating is performed in open-loop mode, with the temperature increase associated with each UV flash calibrated in a separate step.

The back side lamphouse is then turned off and the front side pulse rate is decreased to 2 pulses per second. The wafer is then treated to a five second, five torr UV/Cl$_2$ photochemical process to remove any hydrocarbons and bring the wafer surface to a well defined condition.

The front side lamphouse is next turned off so the wafer temperature is being regulated by the chamber, which itself is under feedback control and maintained at 60° C. At this time, the SiO$_2$ layer is etched away using a forty second, seventy five torr gas phase, HF based process which leaves the silicon surface in a hydrogen terminated state.

When the HF etch is finished, the back side lamphouse is turned on at 7 pulses per second and the chamber is opened to vacuum. The lamphouse remains on for thirty seconds during which time the wafer temperature reaches approximately 150° C. This back side only step is used to thermally desorb any oxygen containing species which are not sufficiently volatile to desorb at 60° C. (during the oxide etch step) without photodesorbing any of the desirable hydrogen termination on the front side of the wafer.

EXAMPLE 2a

In a second example, a silicon wafer with a sacrificial SiO$_2$ layer is processed in the same manner as described in Example 1 until the last step. After the HF oxide etch is finished, both lamphouses are turned on at the maximum power (7 pulses er second) for twenty five seconds to bring the wafer temperature to about 200° C.

The chamber is then filled with Cl$_2$ to five torr and the back side lamp turned off. These conditions are maintained for 30 seconds in order to remove undesirable metal contamination.

EXAMPLE 2b

In a variation on Example 2a, Example 2a is repeated with all conditions remaining the same, except that the chamber is filled with Cl$_2$ to five torr during the temperature ramp step (in which the wafer is heated to 200° C.) rather than during the subsequent photochemistry step, allowing for some photochemistry to occur during the heating step.

What is claimed is as follows:

1. An apparatus for processing a microelectronic device precursor having first and second opposed major surfaces, said apparatus comprising:
    (a) a chamber housing defining a processing chamber in which the microelectronic device precursor is positioned during a treatment;
    (b) a first chamber window positioned in a manner such a first fluence of energy can be irradiated through the first chamber window and onto the first major surface; and
    (c) a second chamber window positioned in a manner such a second fluence of energy can be irradiated through the second chamber window and onto the second major surface;
    (d) a gas inlet through which a flow comprising a processing gas enters the chamber;
    (e) a gas outlet through which the flow exits the chamber, wherein the gas inlet and gas outlet are operatively positioned such that the flow from the gas inlet to the gas outlet is aligned with and moves laterally across the major surfaces of the microelectronic device precursor in a direction from one peripheral side of the microelectronic device precursor to another peripheral side of the microelectronic device precursor.

2. The chamber of claim 1 further comprising:
    (a) a first energy source operationally coupled to the chamber such that the first fluence of energy can be emitted from the first energy source and irradiated onto the first surface of the microelectronic device through the first chamber window; and
    (b) a second energy source operationally coupled to the chamber such that the second fluence of energy can be emitted from the second energy source and irradiated onto the second surface of the microelectronic device through the second chamber window.

3. The apparatus of claim 2 wherein the first energy source is a source of ultraviolet energy and the second energy source is a source of ultraviolet energy.

4. The apparatus of claim 3 wherein the first and second energy sources are ultraviolet lamps.

5. The apparatus of claim 2 further comprising a controller operationally coupled to the first and second energy sources.

6. The apparatus of claim 5 wherein the controller is operable to control the first and second energy sources to provide energy outputs of at least two different time averaged energy levels, a heating level being effective to induce heating of the microelectronic device and a photochemical level being effective to induce a phototreatment of the microelectronic device.

7. The apparatus of claim 6 wherein the first and second energy sources are ultraviolet lamps.

8. The apparatus of claim 7 wherein the outputs of the ultraviolet lamps are characterized by pulse trains, the pulse trains characterized by the number of pulses per second of ultraviolet radiation and the energy per pulse and the controller produces the at least two time averaged energy levels by modulating the number of pulses per second and/or the energy per pulse in the pulse train.

9. The apparatus of claim 8 wherein the controller and ultraviolet lamps are configured so that the power delivered to the microelectronic device by one of the ultraviolet lamps when the ultraviolet lamp is operated at the heating level exceeds the power delivered to the microelectronic device when the ultraviolet lamp is operated at the photochemical level.

10. The apparatus of claim 7 further comprising a chemical delivery system to deliver a chemical to the gas inlet.

11. The apparatus of claim 10 the chemical delivery system further comprising a source of at least one photochemically reactive chemical.

12. The apparatus of claim 11 wherein the at least one photochemically reactive chemical is a halogenated gas.

13. The apparatus of claim 2 further comprising a chemical delivery system to deliver a chemical to the gas inlet.

14. The apparatus of claim 13 the chemical delivery system further comprising a source of at least one photochemically reactive chemical.

15. The apparatus of claim 14 wherein the at least one photochemically reactive chemical is a halogenated gas.

* * * * *